United States Patent [19]

Tamaki et al.

[11] 4,384,204
[45] May 17, 1983

[54] ABSOLUTE ENCODER

[75] Inventors: Hiroshi Tamaki, Tokyo; Fumio Ohtomo, Kawagoe; Kazuaki Kimura, Tokyo, all of Japan

[73] Assignee: Tokyo Kogaku Kikai K.K., Tokyo, Japan

[21] Appl. No.: 272,265

[22] Filed: Jun. 10, 1981

[30] Foreign Application Priority Data

Jun. 17, 1980 [JP] Japan .................................. 55/81699

[51] Int. Cl.³ .............................................. G01B 5/34
[52] U.S. Cl. .......................... 250/237 G; 250/231 SE
[58] Field of Search ..... 250/231 SE, 237 G, 231 GY; 356/395; 340/347 P

[56] References Cited

U.S. PATENT DOCUMENTS

3,270,567  9/1966  Crampton .................... 250/231 GY

Primary Examiner—David C. Nelms
Assistant Examiner—Darwin R. Hostetter
Attorney, Agent, or Firm—Oblon, Fisher, Spivak, McClelland & Maier

[57] ABSTRACT

An absolute encoder comprising a sensor array, a code plate arranged in opposition to the sensor array and having a plurality of blocks in the direction of normal displacement, each block having an address track and a fine reading track, and an arithmetic unit for processing data of the code plate detected by the sensor array. Each of the blocks of the code plate has a reference track, an address track and a fine reading track. The fine reading track of each block has fine reading patterns which change in a direction crossing said direction of normal displacement.

13 Claims, 10 Drawing Figures

ABSOLUTE ENCODER

The present invention relates to an encoder for reading lengths or angles and, more particularly, to an absolute encoder.

Figure 1:
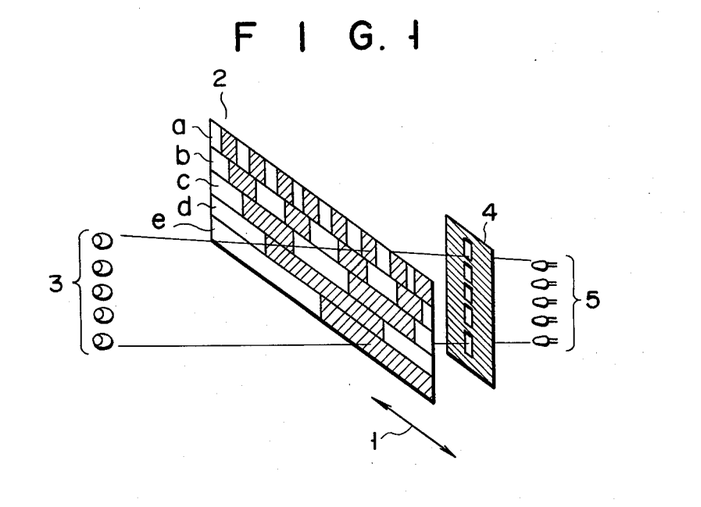
FIG. 1 is a schematic view illustrating the arrangement of a conventional absolute encoder.

According to a conventional absolute encoder as shown in FIG. 1, a code plate 2 which is displaced in the direction shown by arrow 1 has tracks a, b, ... e, each of which has patterns of, for example, binary codes representing positions. These patterns are read with a corresponding system of light sources 3, a mask 4, and photosensors 5. Therefore, according to the absolute system, correct readings may be obtained after restoration to the normal state even in the event of a power failure during measurement, and erratic operation due to electric noise or other accidents. Although this is an important advantage over the incremental system, the absolute system also suffers from some defects which will be described below:

(1) Many light sources and photosensors are required, and the device as a whole thus becomes complex in structure.

(2) Improvement in resolution is hard to obtain due to the restrictions imposed by the pattern precision, sensitivity of the photosensors and so on.

The present invention has been made to overcome these problems of the absolute system and has for its object to provide an absolute encoder with which no error results with a displacement of a code plate in a direction perpendicular to the direction of normal displacement (direction of measurement of length) and which is capable of measuring a displacement in this perpendicular direction.

There is thus provided according to the present invention an absolute encoder having a code plate with a plurality of blocks in the direction of its displacement, said code plate having at least, in each block, both an address track representing an address of the block and a fine reading track representing a fine displacement within the block; a sensor array in which a plurality of sensor elements are arranged in a direction crossing the direction of the relative displacement of the code plate and which is so arranged to detect data of the code plate; and an arithmetic unit for processing the data of the code plate detected by the sensor array, characterized in that fine reading patterns varying in a direction crossing the direction of the relative displacement of the code plate are formed in the fine reading track.

This invention can be more fully understood from the following detailed description when taken in conjunction with the accompanying drawings, in which.

Figure 2:
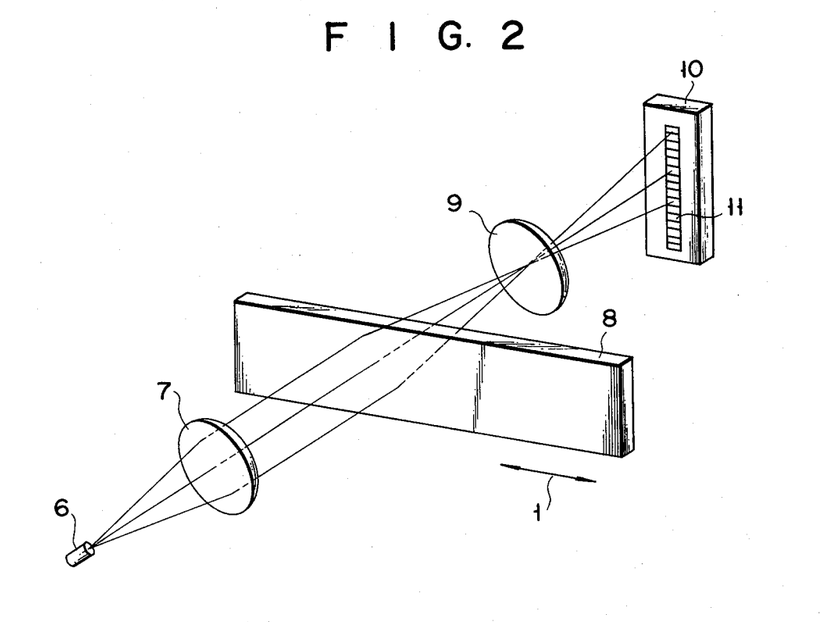
FIG. 2 is a schematic view illustrating a detecting part according to an embodiment of the present invention.
Figure 3A:
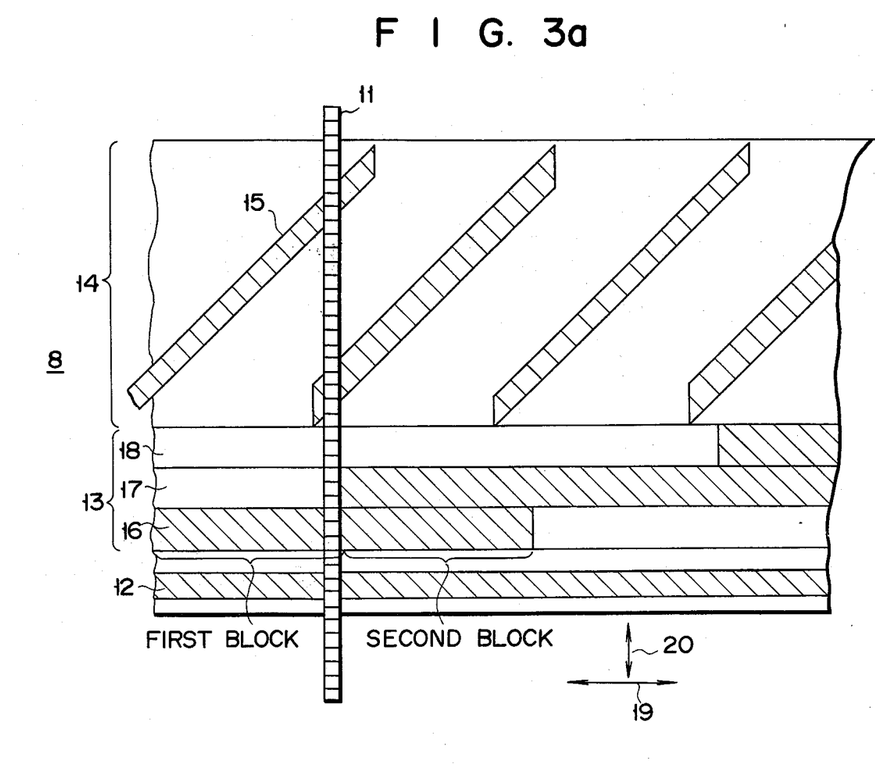
FIGS. 3(a) and 3(b) show, respectively, the arrangement of a code plate and a sensor array according to the embodiment of the present invention, and input and output signals thereof.
Figure 3B:
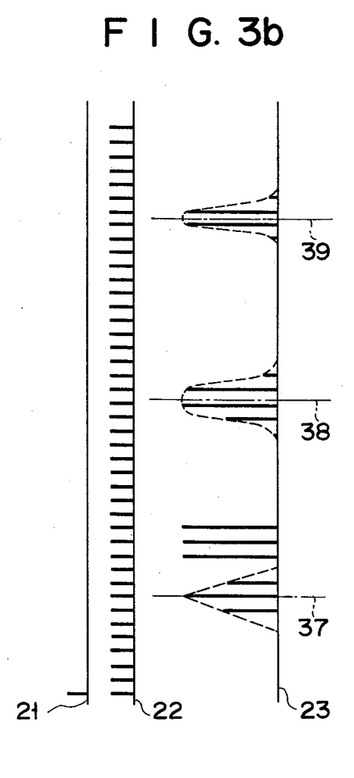
Figure 4:
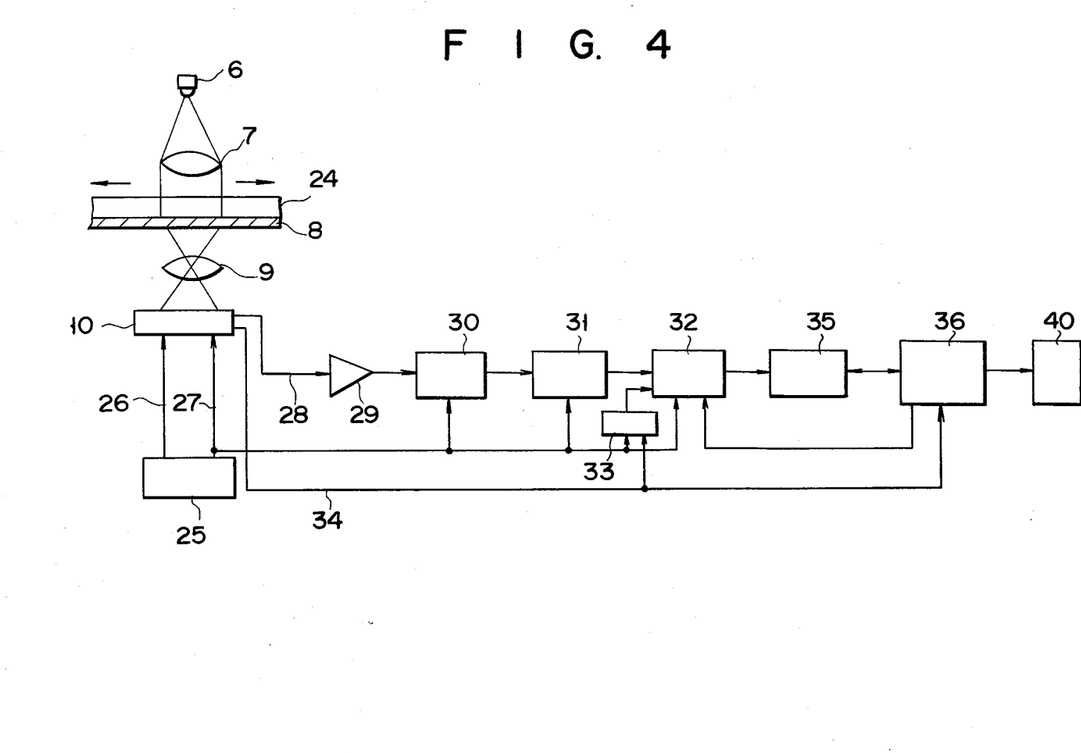
FIG. 4 is a block diagram of the entire system including an electric circuit for performing signal processing according to the embodiment of the present invention.

The preferred embodiments of the present invention will now be described in detail with reference to the accompanying drawings. FIG. 2 is a schematic view of a detecting part according to an embodiment of the present invention. A code plate 8 mounted to a displacement table or the like (not shown) is illuminated by a light source 6 through an illumination lens 7, and an image of the transmitted pattern is formed on a sensor array 11 of a line sensor 10 by a projection lens 9. The line sensor 10 used is of the type which has the sensor array 11 in which the sensor elements of independent sensitivities are arranged in an array, and which outputs signals corresponding to the projected pattern in synchronism with clock pulses. A CCD line sensor is known to be this type of line sensor. FIG. 3(a) shows the relationship between the projected pattern of the code plate 8 on the line sensor 10 with the sensor array 11. The pattern of the code plate 8 comprises, as shown in the figure, a reference track 12, an address track 13, and a fine reading track 14, and is in the relative position with respect to the sensor array 11 as shown in the figure. The reference track 12 indicates the reference position of the entire pattern, designates the bit of the sensor array 11 for reading the address, and indicates the reference position of fine reading patterns 15. The address track has a plurality of further divided tracks 16, 17 and 18. Gray codes are included in the divided tracks for each block divided in a direction 19 of displacement. The patterns 15 are included in the fine reading track 14, the position of which is variable on the sensor array 11 in a direction 20 perpendicular to the direction 19 when the direction 19 of displacement changes. These patterns 15 are slightly longer than each block and are capable of distinguishing adjacent blocks. Although these patterns may be distinguished by thickness in the figure, they may alternatively be distinguished by number or the transmittance. The hatched part in FIG. 3(a) is the part which transmits light. FIG. 3(b) shows the input and output signals of the line sensor arranged as shown in FIG. 3(a), wherein reference numeral 21 denotes a start pulse, 22 denote a clock pulse, and 23 denotes an output signal of a voltage proportional to the intensity of light. FIG. 4 is a block diagram of the entire system according to an embodiment of the present invention. The mode of operation of the entire system will be described referring to FIGS. 3 and 4.

The code plate 8 mounted to a moving object 24 such as a table of a machine tool is illuminated by the light source 6 through the illumination lens 7, and an image of the pattern is formed on the line sensor 10 by the projection lens 9. The line sensor 10 starts scanning in response to a scanning start pulse 26 of a pulse generator 25, and also supplies output signals 28 to an amplifier 29 in synchronism with clock pulses 27 output from the pulse generator 25. The signals which have passed the amplifier 29 are supplied to a sample and hold circuit 30 which holds the peak value of the output of each element as an analog voltage which is converted into a digital signal by an analog to digital converter 31. A digital memory 32 sequentially stores the A/D converted outputs of the line sensor. If the digital memory 32 comprises a random access memory, the outputs of the line sensor are sequentially stored from the zero address of the memory by designating the addresses of the memory by the output of a counter 33 which counts the clock pulses output in synchronism with the outputs of the line sensor. In this manner, the addresses of the memory and the bit numbers of the line sensor may establish a one-to-one correspondence. It is to be noted that the counter 33 must be reset in advance by the scanning start pulse 26 of the line sensor 10 or by a scanning terminating pulse 34. A signal processing circuit 36 comprises, for example, a microprocessor or the like. In response to the scanning terminating pulse 34 of the line sensor, the signal processing circuit 36 transfers the line sensor output data temporarily stored in the digital memory 32 to a data memory 35 under its control and starts processing the data. The operation of the signal processing circuit 36 includes the following:

(1) To determine the central position 37 of the reference track.

(2) To determine the reading bit number of each divided track of the address track and to read the address by executing reading.

(3) To determine the central positions 38 and 39 of the fine reading patterns and to distinguish between thick and thin patterns.

(4) To compute the fine reading value within the block from the distance between the central positions of the fine reading patterns and the central position of the reference track.

(5) To correct the fine reading value obtained with the fine reading patterns with the address obtained with the address track.

(6) To compute the distance between a particular bit (index bit) on the sensor array and the central position of the reference track.

(7) To convert the results obtained in items (5) and (6) into an actual measurement and to produce a corresponding output.

(8) To output a high speed displacing signal by judging the output peak values of the fine reading patterns.

This output is displayed at a display 40 as a position relative to the direction of displacement and the direction perpendicular thereto.

The correction in item (5) above is performed in the manner to be described below. When the line sensor image moves to the left and is located between the first and second blocks in FIG. 3(a), erratic reading is prevented by the following procecure:

(a) When a thin pattern is located above a thick pattern as shown in figure and the read address is an odd number, the address and the fine reading value obtained with the thin pattern are added. If the read address is an even number, 1 is subtracted from the reading and the fine reading value obtained with the thin pattern is added to the subtraction result.

(b) When the thick pattern is located above the thin pattern and the read address is an even number, the read address and the fine reading value obtained with the thick pattern are added. If the read address is an odd number, 1 is subtracted from the reading, and the fine reading value obtained with the thick pattern is added to the subtraction result.

When determining the central positions of the reference track and the fine reading patterns in items (1) and (3) above, the leading and trailing edges were linearly approximated by connecting the points. Then, the central position was obtained as the midpoint of a segment connecting two points at which the output is ½ the maximum value. Since the central position as in item (3) may not be exactly calculated by a linear approximation, a more precise approximation must be made when a higher precision is required.

Figure 8:
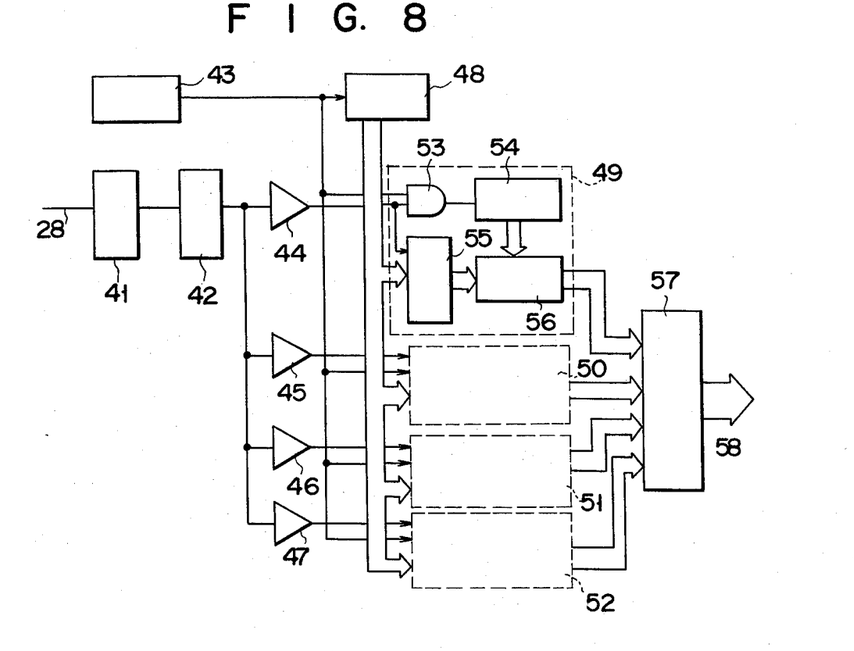
FIG. 8 is a block diagram showing an example of the circuit for reading the position of the projected pattern on the sensor array according to the embodiment of the present invention.

The above description has been made with reference to a case wherein a method is adopted according to which the outputs of the line sensor are sequentially A/D converted to be stored in the memory, and the signal processing circuit such as a microprocessor reads the displacement position data. However, it is to be noted that the same processing may be performed with a hard logic circuit. FIG. 8 shows an example of a circuit for reading with high precision the positions of the reference track or the fine reading patterns projected on the line sensor.

Figure 9:
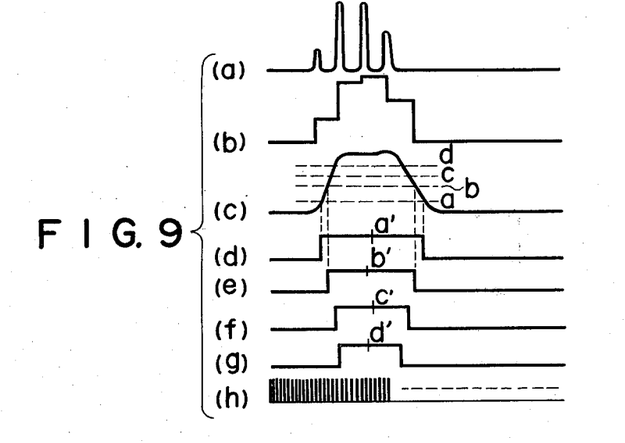
FIG. 9 shows operation waveforms of the respective parts in FIG. 8.

Referring to FIG. 8, although not shown in the figure, counters 48 and 54 are cleared in advance by the start pulse of the line sensor. Referring to this figure, a sample and hold circuit 41 is supplied with the output signals 28 of the line sensor to sample and hold them. When the output of the line sensor with the reference track and the fine reading patterns is as shown in FIG. 9(a), the output of the sample and hold circuit 41 becomes as shown in FIG. 9(b). When this output of the sample and hold cirucit 41 is passed through a smoothing circuit 42, the signal as shown in FIG. 9(c) is obtained. The output of the smoothing circuit 42 is supplied to comparators 44 to 47, each having a different slicing level. When the slicing levels of the comparators 44 to 47 are set as shown a to d of FIG. 9(c), their outputs become as shown in FIGS. 9(d) to 9(g). An oscillator 43 outputs, to the counter 48 and a gate 53, clock pulses of a frequency sufficiently higher than that of the clock pulses scanning the line sensor, and the output of the oscillator 43 is as shown in FIG. 9(h). Counter circuits 49 to 52 are circuits for counting the output of the oscillator 43 from the scanning start point of the line sensor to the central positions (shown as a', b', c' and d' in FIG. 9) of the outputs of the comparators 44 to 47, and the counts of these counter circuits are output to an averaging circuit 57. Thus, an average value 58 obtained by the averaging circuit 57 represents the position of the reference track or the fine reading patterns projected on line sensor with sufficiently high precision. Since the counter circuits 49 to 52 are of the same circuit construction, the description will be made only with reference to the counter circuit 49. At the leading edge of the output of the comparator 44, a latch circuit 55 latches the output of the counter 48 which is counting the output of the oscillator 43 from the scanning start point of the line sensor. Since the gate circuit 53 supplies the output of the oscillator 43 to the counter during the time in which the output of the comparator 44 is "1", the output of the counter 54 represents the length of the period in which the output of the comparator is "1". Therefore, when the output of the counter 54 is shifted by one bit to a lower significant bit, thus reducing the count of the counter 54 to half, and then is added by the adder 56 to the output of the latch circuit 55, the output of the adder 56 is obtained as the count of clock pulses of a frequency sufficiently higher than the frequency of the driving clock pulses for driving the line sensor to the central positions of the leading and trailing edges of the output of the comparator 44. With such measures, it is possible to detect the image formed on the line sensor with a resolution and a precision higher than the pitch of the photosensitive elements of the line sensor.

In comparison with the conventional system according to which the output of the line sensor is A/D converted and processed by a signal processing circuit such as a microprocessor, the system described above may require a complex processing circuit but does not require high speed A/D conversion and allows real-time processing of the output signals of the line sensor so that an encoder which is less expensive and has a high response speed may be provided.

Figure 5:
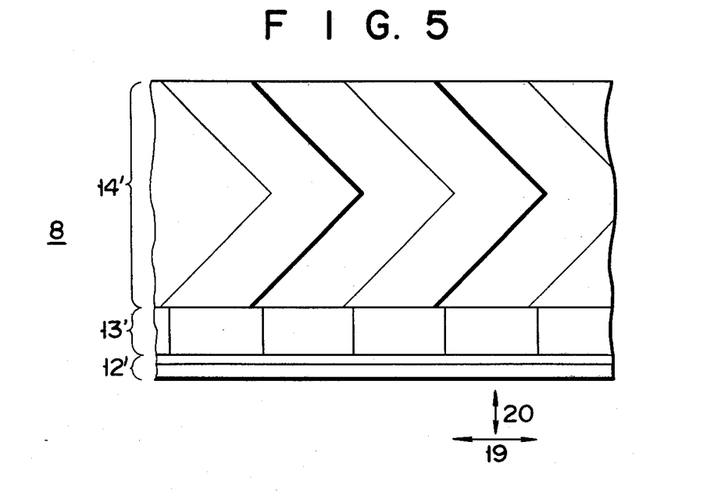
FIGS. 5 to 7 are views illustrating modifications of the patterns of the code plate according to another embodiment of the present invention.
Figure 6:
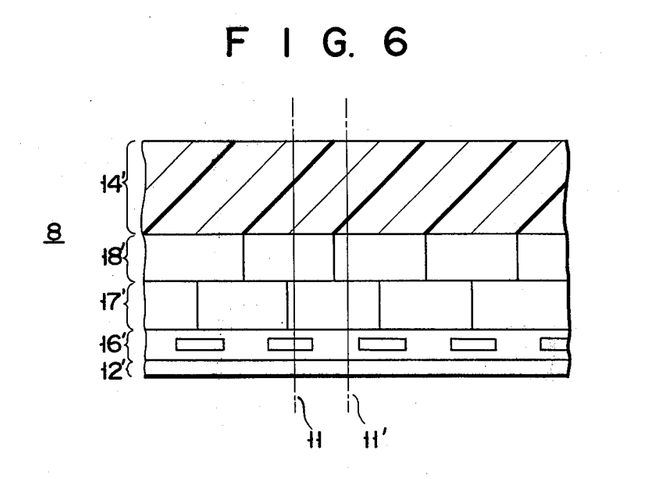
Figure 7:
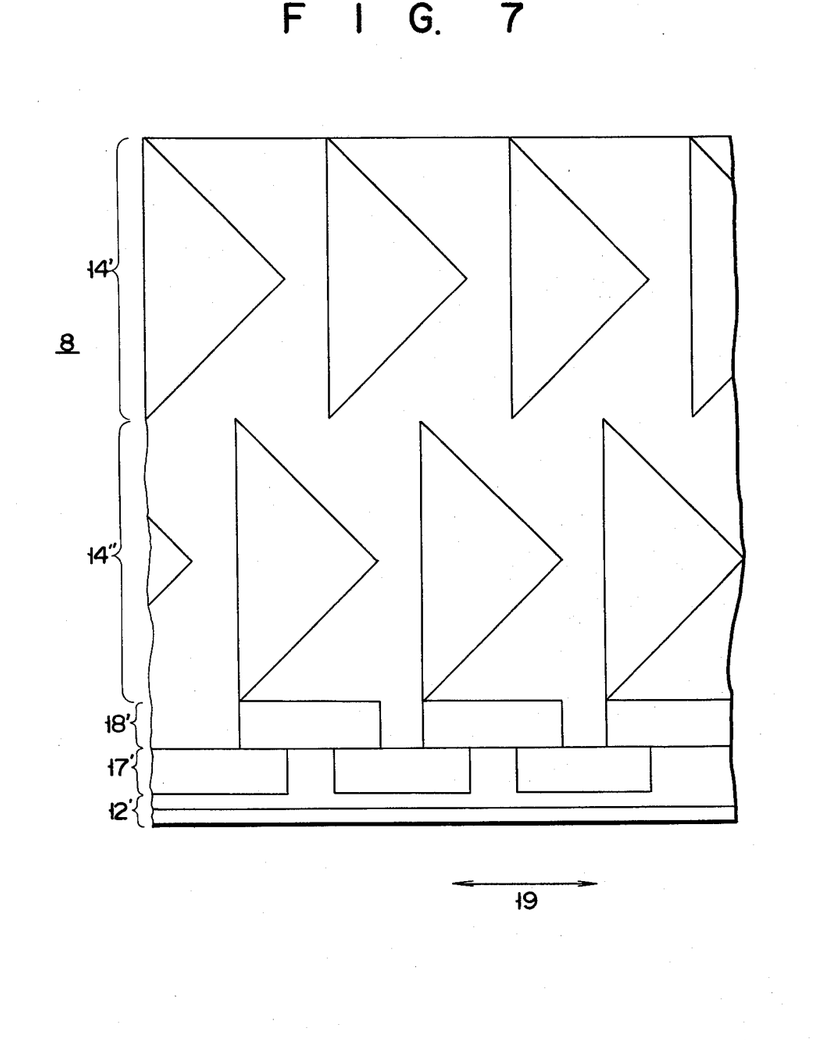

FIGS. 5 to 7 show, in simplified form, patterns of the code plate according to other embodiments of the present invention. In FIG. 5, the fine reading pattern of a fine reading track 14' comprises two patterns which are shifted, upon displacement of the code plate in the direction of normal displacement, in opposite directions along the direction perpendicular thereto. In this embodiment, since the distance between the central points of the two fine reading patterns changes along the direction 19 of normal displacement, fine readings may be obtained by measuring this change. That is to say, fine readings may be obtained even in the absence of a reference pattern. Furthermore, since the change in the distance between the two central points is greater than the change in the distance between the central points of the fine reading pattern and the reference pattern shown in FIG. 3(a), the measurement precision may further be improved. Reference numeral 13' denotes an address track.

FIG. 6 shows an embodiment wherein two address tracks 17' and 18' are incorporated and an address track designating track 16' is also incorporated for designating which one of these address tracks is to be read. The fine reading pattern represented by a thick solid line corresponds to the address track 18', and the fine reading pattern represented by a thin solid line corresponds to the address track 17', these fine reading patterns being within the range of one block of the address track. Referring to FIG. 6, when the line sensor is at position 11, reading is performed with the address track 18' and the corresponding fine reading pattern represented by the thick solid line according to a signal from the address track designating track 16'. On the other hand, when the line sensor is at position 11', reading is performed in a similar manner with the address track 17' and the corresponding fine reading pattern represented by the thin solid line.

In the embodiment shown in FIG. 7, fine reading tracks 14' and 14" each comprise triangular transmitting patterns. When the fine reading track comprises a plurality of tracks as in the case of this embodiment, the fine reading patterns overlapping in the direction 19 of normal displacement may be distinguished so that only one kind of pattern may be required. Further, in the case of this embodiment, which of the address tracks 17' and 18' is to be read is judged according to change of address with time. That is, if the result of the reading indicates an address different from that of the preceding reading of the address track 17', the reading will be performed next time with the address track 18' and the fine reading pattern of the corresponding fine reading track 14". If an address different from that of the preceding reading of the address track 18' is obtained, the reading will be performed next time with the address track 17' and the corresponding fine reading track 14'.

The encoder of the present invention of the construction as described above has the advantages to be described below:

(1) Since a line sensor is used, the electrical system is simple.

(2) Resolution and precision are improved by reading the fine reading patterns in an analog manner. Resolution and precision are particularly improved with patterns which are displaced, upon a change of position of the code plate in the direction of normal displacement, in opposite directions along the direction perpendicular thereto.

(3) Since the reference track is incorporated and the position of the address track is determined with respect to this reference track, a greater relative displacement in the perpendicular direction may be allowed. This is advantageous for manufacture, installation, and maintenance. Since the width of the divided tracks of the address track may be made small, the number of photosensitive elements of the sensor array for reading the address may be reduced to the minimum so that the manufacturing cost may be reduced. The extra elements may be utilized, if desired, for increased redundancy, thereby improving the reliability.

(4) The displacement in the perpendicular direction may also be measured from the distance between the index bit of the sensor array to the central position of the reference pattern.

(5) Even when reading with high precision with the fine reading track is impossible due to a high speed displacement, reading within an accuracy of one bock unit of the address track is still possible. This in an essential condition when the encoder is used for a machine tool or the like. Although gray codes were used in the embodiments shown in FIGS. 3 and 4, they need not be used in the embodiments shown in FIGS. 6 and 7.

Although the code plate and the line sensor have been described as linearly displacing in the above embodiments, a rotary encoder may also be realized by utilizing a ring-shaped code plate. In this case, if the fine reading patterns consist of curved patterns which is known the Archimedes' spirals, higher precision reading will be possible. Furthermore, in the above embodiments, the relative positions of the code plate and the line sensor are measured. However, the pattern of the code plate may be reflected with a reflector or the like to be projected on the sensor array while fixing stationary the code plate and the line sensor, and the displacement of the reflector may be measured. It is to be understood that the reflected image instead of the transmitted image of the code plate may be used.

What we claim is:

1. An absolute encoder having:
    a code plate with a plurality of blocks in the direction of its displacement, said code plate having at least, in each block, both address data representing an address of the block and a fine reading track representing a fine displacement within the block;
    a sensor array in which a plurality of sensor elements are arranged in a direction crossing the direction of displacement of the code plate and which is so arranged to detect data of the code plate; and
    an arithmetic unit for processing the data of the code plate detected by the sensor array,
    characterized in that fine reading patterns varying in a direction crossing the direction of displacement of the code plate are formed in the fine reading track.

2. An absolute encoder according to claim 1, characterized in that said address data comprises an address track having a plurality of parallel and partially overlapping tracks divided in a direction crossing the direction of normal displacement of said code plate.

3. An absolute encoder according to claim 1, characterized in that said fine reading patterns comprise linear or curved patterns at least one of which is inclined with respect to said sensor array.

4. An absolute encoder according to claim 1, characterized in that said fine reading patterns are different in thicknesses, number, or transmittance between adjacent blocks.

5. An absolute encoder according to claim 1, characterized in that said address data is such that the data difference between adjacent blocks is one minimum unit.

6. An absolute encoder according to claim 1, characterized in that said block has a reference track for designating a reading bit of said address track.

7. An absolute encoder according to claim 1, characterized in that said sensor array comprises a CCD.

8. An absolute encoder according to claim 1, characterized in that said fine reading patterns include two patterns which move, upon a displacement of said code plate, in opposite directions along the direction of said sensor array.

9. An absolute encoder according to claim 1, wherein said code plate has a reference track for outputting or displaying the position thereof in said direction crossing the direction of displacement.

10. An absolute encoder according to claim 1, wherein said arithmetic unit is capable of outputting or displaying a high speed displacing signal upon a reduction in a reading signal of said fine reading patterns.

11. An abolute encoder according to claim 1, characterized in that said fine reading patterns comprise plane patterns encoding data different from that of the background.

12. An absolute encoder according to claim 11, characterized in that said fine reading patterns comprise plane patterns at least two border lines of which move, upon a displacement of said code plate, in opposite directions along the direction of said sensor array, said border lines being distinct from the background.

13. An absolute encoder according to claim 1, characterized in that said fine reading patterns are so constructed that part of said fine reading patterns of each block extends to an adjacent block.

* * * * *